United States Patent
Major, Jr. et al.

(10) Patent No.: US 6,330,257 B1
(45) Date of Patent: Dec. 11, 2001

(54) POLARIZATION-INSENSITIVE LASER STABILIZATION USING MULTIPLE WAVEGUIDE GRATINGS

(75) Inventors: Jo S. Major, Jr., San Jose, CA (US); Garnet Luick, Victoria (CA); Ian J. Booth, Sooke (CA); David C. Dawson; Fritz Christo, both of Sidney (CA); Robert G. Waarts, Fremont, CA (US)

(73) Assignee: SDL, Inc., San Jose, CA (US)

( * ) Notice: Subject to any disclaimer, the term of this patent is extended or adjusted under 35 U.S.C. 154(b) by 0 days.

(21) Appl. No.: 09/368,398

(22) Filed: Aug. 4, 1999

Related U.S. Application Data (60) Provisional application No. 60/095,609, filed on Aug. 6, 1998.

(51) Int. Cl.⁷ .................................................. H01S 5/14
(52) U.S. Cl. ......................... 372/29.02; 372/32; 372/102
(58) Field of Search .......................... 372/29.02, 32, 372/92, 96, 99, 106, 102

(56) References Cited

U.S. PATENT DOCUMENTS

| | | | |
|---|---|---|---|
| 4,725,110 | 2/1988 | Glenn et al. | 350/3.61 |
| 5,184,247 | 2/1993 | Schimpe | 359/344 |
| 5,237,576 | 8/1993 | DiGiovanni et al. | 372/6 |
| 5,351,324 | 9/1994 | Forman | 385/37 |
| 5,400,422 | 3/1995 | Askins et al. | 385/37 |
| 5,511,083 | 4/1996 | D'Amato et al. | 372/6 |
| 5,561,675 | 10/1996 | Bayon et al. | 372/6 |
| 5,563,732 * | 10/1996 | Erdogan et al. | 359/341 |
| 5,668,821 | 9/1997 | Hodgson | 372/6 |
| 5,684,297 | 11/1997 | Tardy | 250/227.14 |
| 5,724,377 * | 3/1998 | Huang | 372/98 |
| 6,058,128 * | 5/2000 | Ventrudo | 372/96 |
| 6,215,809 * | 4/2001 | Ziari et al. | 372/96 |
| 6,233,259 * | 5/2001 | Ventrudo et al. | 372/6 |

* cited by examiner

*Primary Examiner*—James W. Davie
(74) *Attorney, Agent, or Firm*—David N. Lathrop, Esq.; Gallagher & Lathrop (57) ABSTRACT

The effectiveness of reflected light to stabilize the operational characteristics of a semiconductor diode laser varies with the polarization orientation of the reflected light. Stabilization failure can occur if the polarization orientation of the reflected light is orthogonal to the polarization of the light emitted by the laser source. The use of multiple reflectors can reduce the probability of stabilization failure by arranging the reflectors to return to the laser source portions of light having polarization orientations that are statistically independent with respect to each other.

57 Claims, 3 Drawing Sheets

POLARIZATION-INSENSITIVE LASER STABILIZATION USING MULTIPLE WAVEGUIDE GRATINGS

CROSS-REFERENCE TO RELATED APPLICATIONS

This application claims priority benefits of prior filed copending U.S. provisional application Ser. No. 60/095,609, filed Aug. 6, 1998, which is incorporated herein by reference.

TECHNICAL FIELD

The present invention pertains generally to the use of optical waveguide reflectors to stabilize the operational characteristics of laser sources such as semiconductor diode lasers, and pertains more specifically to the use of multiple reflectors such as fiber Bragg gratings to improve the operational stability of laser sources when the laser sources are used with optical waveguides that do not maintain polarization.

BACKGROUND ART

The operational characteristics of a laser source such as a semiconductor diode laser can be stabilized by reflecting a portion of the light emitted by the laser source back into the laser source's internal cavity. In applications where the emitted light of a laser source is coupled into an optical waveguide such as an optical fiber, these reflections can be obtained by forming reflectors in the optical waveguide. One common reflector is known as a fiber Bragg grating.

The operational characteristics of the laser source are said to be stabilized in the sense that the wavelength of the emitted light can be kept within a desired bandwidth and the emitted light power of the laser source is seen to vary more smoothly with variations laser drive current, operating temperature, component aging, etc. If the laser source is used to pump a gain medium such as a fiber amplifier or a fiber laser, for example, the stabilized operational characteristics manifest themselves as reduced noise in the pumped gain medium.

The operational characteristics may be stabilized by reflecting light back into the internal cavity of the laser source in such a manner that the laser source is forced to operate in a mode known as coherence collapse. Additional information regarding the operation of a laser source in coherence collapse is provided in U.S. Pat. No. 5,563,732, for example, which is incorporated herein by reference.

One requirement for coherence collapse is that the amplitude of the reflected light must be large enough to perturb the longitudinal mode hopping behavior of the laser source. An adequate amplitude can be achieved by using a reflector with a sufficiently high reflectivity level and, in many applications, a reflectivity level from about 2% to about 5% is sufficient. For example, see U.S. Pat. Nos. 5,485,481 and 5,724,377, both of which are incorporated herein by reference. Preferably, the level of reflectivity is set no higher than that necessary to maintain coherence collapse because the reflected light represents power lost from the application for which the laser source is used.

Another requirement for coherence collapse is that the reflected light must not be fully coherent in phase with the light emitted from the laser source. Phase incoherence between emitted light and reflected light can be achieved by ensuring the reflected light is returned by a reflector that is formed at an "optical distance" from the laser source that is approximately equal to or greater than the so called "coherence length" of the laser source. The coherence length depends upon a number of factors including the center frequency and bandwidth of the reflector, the reflectivity levels of the reflector and front facet of the laser source, and the magnitude of the drive current used to operate the laser source. In many applications, the coherence length of a semiconductor diode laser source is 50 cm. or more. The term "optical distance" refers to the distance that is measured along the optical path of the light.

Unfortunately, some systems that use reflectors to stabilize a laser source sometimes fail in the sense that the laser source drops out of coherence collapse and operates for an appreciable length of time in one of a number of longitudinal modes with occasional jumps between modes. Some applications cannot tolerate the noise that results from such operation; therefore, there is a need for an efficient low-cost way to stabilize a laser source that avoids these failures.

It has been determined that the cause of these failures is related to the polarization characteristics of the laser source and the optical waveguide. Three characteristics are particularly important: (1) laser sources like semiconductor diode lasers emit light that is polarized; (2) if this light is coupled into an optical waveguides such as birefringent optical fiber that is insensitive to polarization, the polarization of the emitted light is allowed to rotate as it travels along the waveguide and the polarization of the reflected light is also allowed to rotate as it travels along the waveguide from the reflector to the laser source; and (3) laser sources like semiconductor diode lasers are insensitive or "blind" to reflected light that is polarized orthogonally to the polarization of the light emitted by the laser source.

A semiconductor diode laser, for example, is more easily forced into coherence collapse if the reflected light is polarized in the plane of the diode junction. Conversely, coherence collapse is much more difficult if not impossible to achieve if the reflected light is polarized orthogonally to the plane of the diode junction. Under certain conditions, a polarization-insensitive optical waveguide will allow the polarization of the light reflected back to the laser source to be oriented substantially orthogonal to the polarization of the emitted light. If the laser source is insensitive to reflected light with such a polarization, the laser source will operate in a free-running state with erratic jumps in wavelength and operating modes.

The amount by which the polarization of reflected light rotates depends on a number of factors including transmission characteristics of the optical waveguide, length of the optical waveguide between the laser source and the reflector, wavelength of the light emitted by the laser source, and center frequency and bandwidth of the reflector. Generally speaking, it should be possible to arrange the optical waveguide and the reflectors to cause reflected light to be polarized orthogonally to the polarization of the emitted light. For example, additional polarization rotation can be obtained by coiling or otherwise stressing the optical fiber to induce birefringence into the waveguide.

One solution for this problem is to use a polarization-sensitive optical waveguide that maintains polarization so that reflected light and the emitted light have the same polarization orientation. For example, see U.S. Pat. No. 5,659,559, which is incorporated herein by reference. The use of polarization-maintaining (PM) waveguides is generally not attractive, however, because the cost of PM waveguides is higher and the alignment of PM waveguides is more difficult than that encountered with non-PM waveguides.

Another solution for this problem is to form the reflector in the waveguide at an optical distance from the laser source that is so small that the polarization of the light is not able to rotate by as much as ninety degrees in a round trip. If an optical waveguide such as optical fiber is tightly coiled, however, enough birefringence can be induced into the fiber to reduce this optical distance to perhaps 10 cm. or less. Unfortunately, this solution conflicts with the need to separate the reflector from the laser source by an optical distance that exceeds the coherence length of the laser source so that coherence collapse can be achieved.

Yet another solution, or at least a partial solution, is to increase the amplitude of the reflected light so that, as the polarization of the reflected light approaches orthogonality, the non-orthogonal component of the light has sufficient amplitude to stabilize the laser source. It is believed that the required increase varies inversely with the cosine of the polarization angle. For example, if a unit amplitude of light that is optimally polarized (polarization angle of zero degrees) is just sufficient to stabilize a laser source, then two units of amplitude would be required for a polarization angle of sixty degrees and about six units of amplitude would be required for a polarization angle of eighty degrees. Unfortunately, higher levels of reflectivity reduce the effective output power of a laser source. In addition, this solution does not stabilize operation as the polarization angle approaches ninety degrees.

DISCLOSURE OF INVENTION

It is an object of the present invention to provide an efficient low-cost way to stabilize the operating characteristics of a laser source that overcomes the problems discussed above.

According to the teachings of one aspect of the present invention, a method for stabilizing operational characteristics of a laser source comprises the steps of receiving light from an output of the laser source into an optical waveguide that is polarization insensitive to the light, and reflecting portions of the light back to the laser source output from a plurality of reflectors such that the portions of light have two or more polarization orientations at the laser source output.

According to the teachings of another aspect of the present invention, an apparatus for stabilizing operational characteristics of a laser source comprises an optical waveguide coupled to an output of the laser source, wherein the optical waveguide receives light emitted from the laser source output and is polarization insensitive to the light, and a plurality of reflectors arranged to reflect portions of the light back to the laser source output such that the portions of light have two or more polarization orientations at the laser source output.

According to the teachings of yet another aspect of the present invention, an apparatus comprises a laser source having an output for emission of light with a polarization orientation, and an optical waveguide coupled to receive the light from the laser source output and having a plurality of reflectors, wherein the optical waveguide is polarization insensitive to the light and the plurality of reflectors are arranged to reflect portions of the light back to the laser source output to effect a higher level of stability in the laser source than is effected by a respective portion of light reflected by a single reflector.

According to the teachings of a further aspect of the present invention, an apparatus comprises a laser source having an output through which light is emitted, and an optical waveguide coupled to the laser source output and comprising a first reflector and a second reflector, wherein the optical waveguide is polarization insensitive to the light and the first and second reflectors are arranged to reflect respective portions of the light back to the laser source output such that the portion of light reflected from the first reflector is substantially incoherent with respect to the portion of light reflected from the second reflector.

According to the teachings of yet a further aspect of the present invention, an apparatus for stabilizing operational characteristics of a plurality of laser sources comprises a plurality of optical waveguides that are polarization insensitive to light, wherein each optical waveguide is coupled to an output of a respective laser source and is coupled to one or more of the other optical waveguides, and a plurality of reflectors formed in or coupled to the optical waveguides.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Advantages of Multiple Reflectors

1. One Reflector

Figure 1:
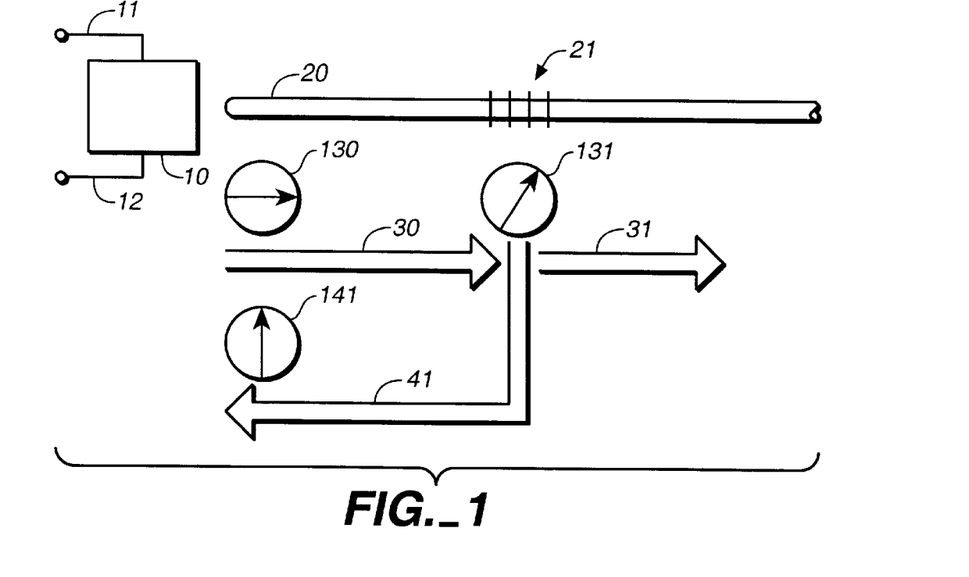
FIG. 1 is a schematic illustration of a laser source optically coupled to a polarization-insensitive optical waveguide in which a reflector is formed.

FIG. 1 is a schematic illustration of an embodiment of laser source 10 optically coupled to polarization-insensitive optical waveguide 20 in which reflector 21 is formed. For example, optical waveguide 20 may be a single-clad or double-clad optical fiber and reflector 21 may be a fiber Bragg grating that is formed in the optical fiber. Preferably, optical waveguide 20 is a single-mode optical fiber. Laser source 10 is driven by an electrical signal presented through terminals 11 and 12. Other features such as a heat sink and laser output monitoring components that may be important in a practical embodiment are not shown in the figure to improve illustrative clarity.

Throughout this disclosure, more particular mention is made of reflectors such as fiber Bragg gratings that are formed in optical waveguide 20; however, reflectors may be implemented in a variety of ways such as by a mirror or other reflective surface that is optically coupled to optical waveguide 20 in some manner such as by a fused optical coupler or planar waveguide coupler. No particular type of reflector is critical to the practice of the present invention.

Symbol 130 represents the polarization orientation of light 30 emitted by laser source 10. Because optical waveguide 20 is polarization insensitive, the polarization orientation of light 30 is allowed to change as emitted light 30 propagates along the waveguide away from laser source 10. The exact manner in which polarization changes depends on a number of factors including transmission characteristics of optical waveguide 20 and the particular wavelength and longitudinal mode in which laser source 10 operates. For ease of discussion, the transmission characteristics of optical waveguide 20 are assumed to be the same for the various illustrations and embodiments discussed herein unless expressly stated otherwise. Symbol 131 represents the polarization orientation of emitted light 30 as it arrives at reflector 21 for a particular wavelength and longitudinal operating mode for laser source 10.

A portion 41 of emitted light 30 is reflected by reflector 21 toward laser source 10. Light 31 that is not reflected by reflector 21 continues along optical waveguide 20 away from laser source 10 and is available for use in some application such as pumping an optical gain medium. Because optical waveguide 20 is polarization insensitive, the polarization orientation of reflected light 41 is allowed to change as reflected light 41 propagates along the waveguide toward laser source 10. Symbol 141 represents the polarization orientation of reflected light 41 as it arrives at laser source 10 for the particular wavelength and longitudinal operating mode of laser source 10 mentioned above.

In the embodiment illustrated in FIG. 1, polarization orientation 141 of reflected light 41 is orthogonal to polarization orientation 130 of emitted light 30. If laser source is a semiconductor diode laser, for example, orthogonally-polarized reflected light 41 is ineffective as a stabilizing influence because it is not able to induce laser source 10 to operate in coherence-collapse mode. This particular polarization results in a "stabilization failure" because it allows laser source 10 to operate in a free-running state with erratic jumps in wavelength and operating modes.

As mentioned above, the ability to operate a laser source in coherence collapse depends on a number of factors including the magnitude of the drive current used to operate the laser source, the reflectivity levels of the front facet of the laser source and the reflector formed in the optical waveguide, the optical distance between the laser source and the reflector, the center frequency and bandwidth of the reflector, and the polarization of the light reflected back to the laser source. For ease of discussion, it is assumed in the following description that all pertinent factors that are not expressly mentioned below, such as the magnitude of the drive current, are suitable for achieving coherence collapse. Thus, the question whether a particular embodiment can achieve coherence collapse is simplified to a consideration whether reflectivity levels and placement of reflectors and the polarization orientation of the light reflected by those reflectors are suitable for achieving coherence collapse.

2. First Embodiment of Two Reflectors

Figure 2A:
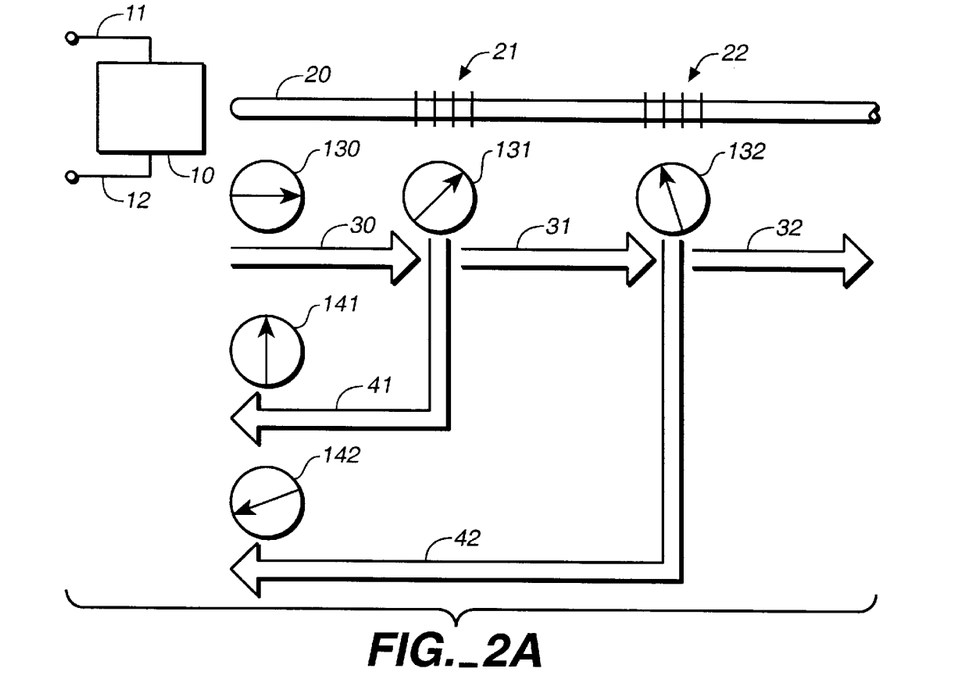
FIGS. 2A and 2B are schematic illustrations of a laser source optically coupled to a polarization-insensitive optical waveguide in which two reflectors are formed.

FIG. 2A is a schematic illustration of another embodiment of laser source 10 optically coupled to polarization-insensitive optical waveguide 20 in which reflector 21 is formed. These features, including the operating mode of laser source 10, the polarization orientation of emitted light 30 and the polarization orientation of reflected light 41, are identical to corresponding features in the embodiment illustrated in FIG. 1. In the embodiment illustrated in FIG. 2A, however, an additional reflector 22 is formed in optical waveguide 20. Symbol 132 represents the polarization orientation of light 31, which is not reflected by reflector 21, as it arrives at reflector 22.

A portion 42 of light 31 is reflected by reflector 22 toward laser source 10. The light 32 that is not reflected by reflector 22 continues along optical waveguide 20 away from laser source 10 and is available for use in an application. Because optical waveguide 20 is polarization insensitive, the polarization orientation of reflected light 42 is allowed to change as reflected light 42 propagates along the waveguide toward laser source 10. Symbol 142 represents the polarization orientation of reflected light 42 as it arrives at laser source 10 for the particular wavelength and longitudinal operating mode of laser source 10 mentioned above.

In the embodiment illustrated in FIG. 2A, polarization orientation 141 of reflected light 41 is orthogonal to the polarization orientation 130 of emitted light 30, exactly as shown in FIG. 1. As explained above, this particular orientation renders reflected light 41 ineffective as a stabilizing influence on laser source 10. In contrast to this, polarization orientation 142 of reflected light 42 is nearly parallel to the polarization orientation 130 of emitted light 30, which allows reflected light 42 to provide an effective stabilizing influence on laser source 10. Whether reflected light 42 actually does stabilize laser source 10 depends on the amplitude of the reflected light, which can be controlled by the reflectivity level of reflector 22. If the reflectivity level of reflector 22 is great enough, stabilization failure can be avoided in the embodiment illustrated in FIG. 2A because reflected light 42 will provide an effective stabilizing influence.

3. Second Embodiment of Two Reflectors

Figure 2B:
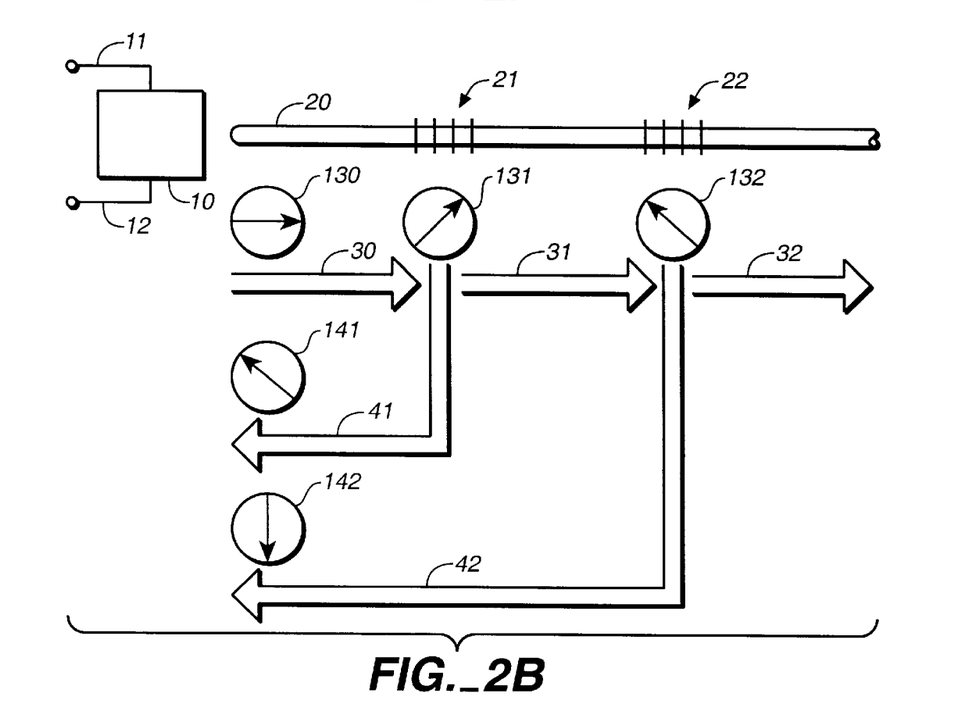

FIG. 2B is a schematic illustration of yet another embodiment of laser source 10 optically coupled to polarization-insensitive optical waveguide 20, which comprises reflectors 21 and 22. The only difference between the embodiment of FIG. 2B and the embodiment of FIG. 2A is a difference in polarization orientations 131, 132, 141 and 142. A number of factors may cause a change in polarization orientation such as stress in optical waveguide 20, perhaps induced by coiling, changes in ambient temperature or changes in laser source drive current. Thus, the embodiments illustrated in FIGS. 2A and 2B can be considered representative of the same apparatus at two different instants of time.

In the embodiment illustrated in FIG. 2B, the polarization orientation 142 of reflected light 42 is substantially orthogonal to the polarization orientation 130 of emitted light 30; therefore, reflected light 42 is ineffective as a stabilizing influence on laser source 10. In contrast to this, the polarization orientation 141 of reflected light 41 is more nearly parallel to the polarization orientation 130 of emitted light 30, which allows reflected light 41 to provide an effective stabilizing influence on laser source 10. As mentioned above, whether reflected light 41 actually does stabilize laser source 10 depends on the amplitude of the reflected light, which can be controlled by the reflectivity level of reflector 21. If the reflectivity level of reflector 21 is great enough, stabilization failure can be avoided in the embodiment illustrated in FIG. 2B because reflected light 41 will provide an effective stabilizing influence.

4. Improved Stability

For either embodiment shown in FIGS. 2A and 2B, assuming the amplitudes of reflected light 41 and 42 are great enough, stabilization failure will occur only if both polarization orientations 141 and 142 are substantially orthogonal to the polarization orientation 130 of emitted light 30. The probability of this occurrence can be expressed as the product of two probabilities $P_1 \cdot P_2$ if $P_1$ and $P_2$ are statistically independent, where $P_1$ is the probability that reflected light 41 is an ineffective stabilizing influence because polarization orientation 141 is sufficiently close to orthogonality with polarization 130, and $P_2$ is the probability that reflected light 42 is an ineffective stabilizing influence because polarization orientation 142 is sufficiently close to orthogonality with polarization 130. Substantial statistical independence between $P_1$ and $P_2$ can be achieved if various considerations for forming reflectors 21 and 22 in optical waveguide 20 are taken into account. These considerations are discussed below.

Figure 3:
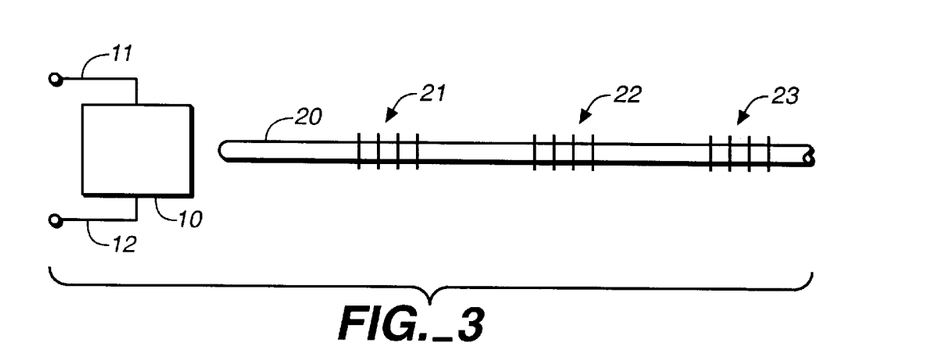
FIG. 3 is a schematic illustration of a laser source optically coupled to a polarization-insensitive optical waveguide in which three reflectors are formed.

Operational stability can be improved by using essentially any number of reflectors. For example, operational stability of laser source 10 can be improved by forming three reflectors 21, 22 and 23 in optical waveguide 20 as shown in FIG. 3.

5. Improved Efficiency

The use of two or more reflectors can also improve the operational efficiency of a laser source by reducing the total amount of reflected light that is required to achieve operational stability. If only one reflector is used, the level of reflectivity for that one reflector must be high enough to reflect light with a sufficient amplitude to stabilize the laser source across a specified range of polarization orientations. As explained above, it is believed that the increase in reflectivity varies inversely with the cosine of the maximum polarization angle in the specified range. If the specified range of orientations extends to 80 degrees, for example, the reflectivity level should be about six times the minimum level required if the specified range was limited to an orientation of zero degrees. If the specified range of orientations could be limited to 60 degrees, then the reflectivity level would need to be only about two times the minimum level.

For example, if a reflectivity level of 0.5% is deemed to be just sufficient to stabilize a laser source with a reflection that is optimally polarized, then a single reflector that is intended to stabilize the laser source across a specified range of ±88 degrees should have a reflectivity level of more than 14%. If all polarization orientations were equally likely, this embodiment would have more than a 2% (2/90) chance of stabilization failure and the maximum efficiency of the apparatus would be about 86% due to the 14% loss in the reflected light. If two reflectors are used, however, the specified range of orientations for each reflector could be reduced to ±80 degrees and the reflectivity level for each reflector could be reduced to less than 3%. The maximum efficiency of the apparatus would increase to about 97% and the probability of stabilization failure would be reduced to about 1% (10/90·10/90), assuming all polarization orientations for the light reflected by the two reflectors are equally likely.

This example is presented only to illustrate basic principles. The values and assumptions made for this example do not represent empirical findings and they should not be considered recommended design parameters.

B. Formation of Reflectors

1. Considerations

Several considerations should be taken into account when deciding where and how reflectors are formed in the optical waveguide. Preferably, each reflector formed in optical waveguide 20 has a level of reflectivity great enough to reflect a respective portion of emitted light 30 that is capable of independently stabilizing laser source 10 across a range of polarization orientations. Alternatively, a plurality of reflectors may be formed in optical waveguide 20 in such a manner that no one of the plural reflectors can stabilize laser source 10 but the plurality of reflectors cooperatively can stabilize laser source 10 for one or more polarization orientations.

All of the reflectors formed in optical waveguide 20 may have substantially the same level of reflectivity or they may differ significantly as desired. The bandwidth of all the reflectors may be substantially the same or they may also differ significantly as desired. No particular bandwidth is critical to the present invention, but the bandwidths of the reflectors should include the desired range of wavelengths within which laser source 10 is intended to operate.

In one embodiment, reflector 21 that is closest to laser source 10 is formed in optical waveguide 20 at an optical distance from laser source 10 along the waveguide that exceeds the "coherence length" of laser source 10. As explained in U.S. Pat. Nos. 5,485,481 and 5,563,732 cited above, this optical distance helps ensure that reflected light 41 reflected by reflector 21 will successfully induce laser source 10 to operate in coherence collapse.

Alternatively, one or more reflectors may be formed in optical waveguide 20 at an optical distance from laser source 10 along the waveguide that does not exceed the coherence length of laser source 10 by modulating the electrical signal that drives laser source 10. Additional information may be obtained from U.S. patent application Ser./No. 08/621,555 filed Mar. 25, 1996 Pat. No. 6,058,128 and from U.S. patent application Ser./No. 09/197,062 filed Nov. 20, 1998, Pat. No. 6,215,809 both of which are incorporated herein by reference.

Preferably, the optical distance along waveguide 20 between adjacent reflectors is such that one or more of the following criteria are satisfied: (1) the average difference between the polarization orientations of light reflected from two adjacent reflectors exceeds about 45 degrees; (2) the optical distance between adjacent reflectors exceeds the coherence length of laser source 10; (3) the relative polarization of the light reflected from two adjacent reflectors varies in a substantially random manner; and/or (4) the portions of light that are reflected from two adjacent reflectors are substantially incoherent with respect to each other.

Figure 4:
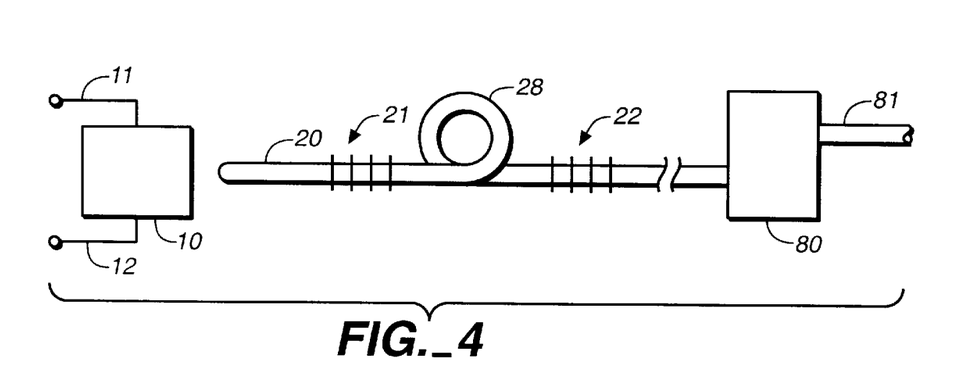
FIG. 4 is a schematic illustration of a laser source optically coupled to a polarization-insensitive optical waveguide in which two reflectors are formed, and which in turn is coupled to an optical gain medium.

The optical distance between reflectors and possibly the optical distance between laser source 10 and the closest reflector may be decreased by increasing the birefringent properties of optical waveguide 20. This may be accomplished in a number of ways such as by coiling or twisting the waveguide, or by using a clamp to apply pressure along the length of the waveguide. FIG. 4 provides a schematic illustration of laser source 10 coupled to optical waveguide 20, which has coil 28 between reflectors 21 and 22 to increase the birefringent properties of the waveguide between the reflectors. The figure also shows that a laser source stabilized according to the present invention may be used as a pump laser for an optical gain medium. In the example shown, optical waveguide 20 is coupled to gain medium 81 by way of optical coupler 80. Gain medium 81 may be a fiber amplifier, a fiber laser, or essentially any other type of gain medium.

2. Reflectors and Waveguides

Figure 5:
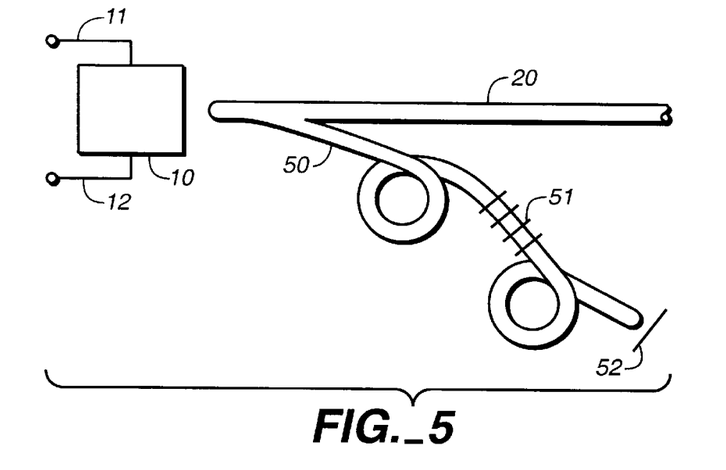
FIG. 5 is a schematic illustration of a laser source optically coupled to a first optical waveguide, which in turn is optically coupled to reflectors by a second optical waveguide.

Essentially any type of reflector and optical waveguide may be used to practice the present invention. The schematic illustration shown in FIG. 3, for example, suggests the reflectors are chirped or Bragg gratings formed in a single-clad or double-clad optical fiber. In the embodiment shown in FIG. 5, two reflectors are formed by grating 51 and mirror 52, which are optically coupled to waveguide 20 by optical waveguide 50. Optical waveguide 50 may be coupled to optical waveguide 20 in essentially any manner such as by a fused coupler, planar waveguide coupler or a coupler implemented by bulk optics or micro optics. Coupling between optical waveguide 50 and mirror 52 may be facilitated by optics including lenses or butt coupling.

3. Optical Couplers a) Multiple Laser Sources

Figure 6A:
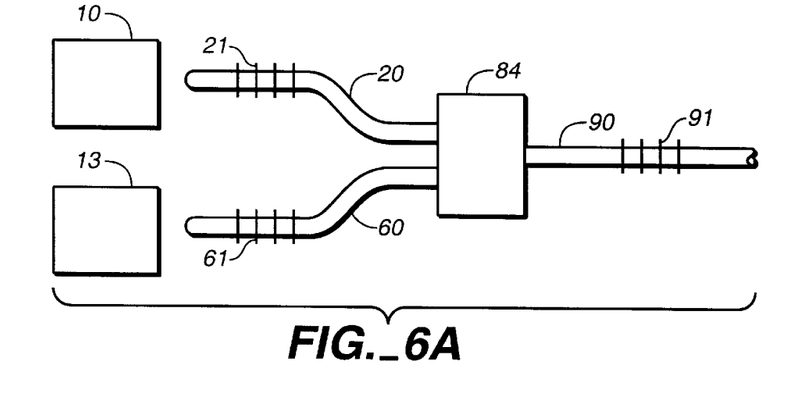
FIGS. 6A and 6B are schematic illustrations of multiple laser sources sharing a reflector.
Figure 6B:
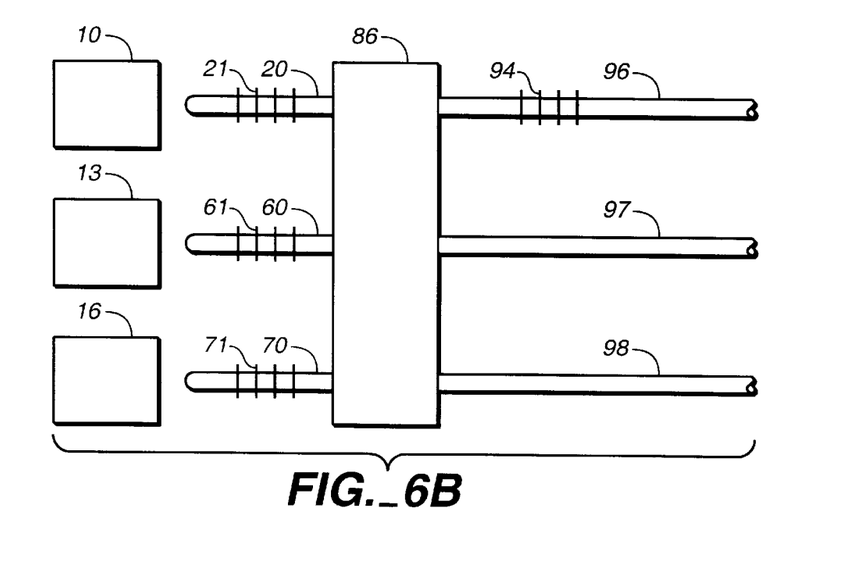

FIGS. 6A and 6B illustrate systems in which optical couplers are used to allow multiple laser sources to share a reflector. The illustrated embodiments may be modifed by interposing a coupler between the multiple laser sources and the closest reflector to allow all reflectors in a system to be shared. The optical couplers may be implemented in essentially any manner that is suitable for use with the optical waveguides coupled to the laser sources. For example, optical fibers may be coupled by fused couplers and planar waveguides such as silica waveguides may be coupled by planar waveguide couplers. Bulk and micro optics can implement optical couplers that can used with essentially any type of waveguide. Furthermore, the various features discussed above may be combined with the features discussed here.

Referring to the embodiment shown in FIG. 6A, laser source 10 is optically coupled to optical waveguide 20 in which reflector 21 is formed and laser source 13 is optically coupled to optical waveguide 60 in which reflector 61 is formed. In this embodiment, for example, laser source 10 emits light at one or more wavelengths within a first range of wavelengths including a first wavelength $\lambda_1$, reflector 21 reflects light at the first wavelength $\lambda_1$, laser source 20 emits light at one or more wavelengths within a second range of wavelengths including a second wavelength $\lambda_2$, and reflector 61 reflects light at the second wavelength $\lambda_2$. Coupler 84, which in this example is a wavelength selective 2×1 coupler or WDM, receives and multiplexes the light received from optical waveguide 20 and from optical waveguide 60 and passes the multiplexed light to optical waveguide 90 in which reflector 91 is formed.

Reflector 91 reflects light at both the first wavelength $\lambda_1$ and the second wavelength $\lambda_2$. The light reflected by reflector 91 is received and demultiplexed by coupler 84 according to wavelength and passed to optical waveguides 20 and 60. Reflected light having the first wavelength $\lambda_1$ is returned to laser source 10 through optical waveguide 20 and reflected light having the second wavelength $\lambda_2$ is returned to laser source 13 through optical waveguide 60. The light passed to optical waveguide 90 that is not reflected by reflector 91 is available for use in an application such as pumping a gain medium. Optical losses and coupling-decoupling effects of coupler 84 should be taken into account when setting the reflectivity level of reflector 91.

In another example in which laser sources 10 and 13 emit light at the same or substantially the same wavelengths, coupler 84 shown in FIG. 6A need not be wavelength selective and reflectors 21, 61 and 91 may reflect light at the same or substantially the same wavelengths.

Referring to the embodiment shown in FIG. 6B, laser sources 10, 13 and 16 are optically coupled to optical waveguides 20, 60 and 70, respectively, in which reflectors 21, 61 and 71 are formed. Laser sources 10, 13 and 16 may emit light at essentially any wavelength and reflectors 21, 61 and 71 are designed to reflect light at the wavelengths of their respective laser sources. Optical waveguides 20, 60 and 70 are coupled by coupler 86, which in the example shown is a 3×3 coupler that passes the coupled light to optical waveguides 96, 97 and 98.

Reflector 94, which is formed in optical waveguide 96, is designed to reflect light within a range of wavelengths that includes the one or more wavelengths reflected by reflectors 21, 61 and 71. The light that is passed to optical waveguides 97 and 98 is available for use in one or more applications such as pumping a single gain medium at multiple locations, and the light passed to optical waveguide 96 that is not reflected by reflector 94 is also available for use in an application. In an alternate embodiment, reflector 94 is implemented by a mirror that is coupled to optical waveguide 96. In this alternate embodiment, only light passed to optical waveguides 97 and 98 is available for use in an application. Optical losses and coupling effects of coupler 86 should be taken into account when setting the reflectivity level of reflector 94.

b) Single Laser Source

In yet another embodiment not shown, a single laser source is coupled to an optical waveguide that, in turn, is coupled to two or more optical waveguides by a 1×N optical coupler. Multiple reflectors may be formed in or coupled to the two or more optical waveguides in essentially any manner to provide respective portions of reflected light according to the present invention to improve the stability of the operational characteristics of the laser source.

c) Alternate Structures

The examples discussed above are presented to show that an optical coupler of essentially any N×M configuration may be used to stabilize the operational characteristics of one or more laser sources. In embodiments for a single laser source, a 1×M coupler may be used where M>1. In embodiments for multiple laser sources, an N×M coupler may be used, where N is equal to the number of laser sources and M>1. Wavelength-selective couplers or WDM may be used as necessary or desired.

What is claimed is:

1. A method for stabilizing operational characteristics of a laser source, the method comprising:

receiving light from an output of the laser source into an optical waveguide that is polarization insensitive to the light; and reflecting portions of the light back to the laser source output from a plurality of reflectors such that the portions of light have two or more polarization orientations at the laser source output.

2. A method according to claim 1 wherein respective portions of light reflected by two or more of the plurality of reflectors collectively stabilize the laser source in a coherence-collapse mode of operation for one or more polarization orientations at the laser source output.

3. A method according to claim 1 wherein a respective reflector reflects back to the laser source output a respective portion of the light that stabilizes the laser source in a coherence-collapse mode of operation for one or more polarization orientations of the respective portion of light at the laser source output.

4. A method according to claim I wherein the optical waveguide comprises optical fiber and the reflectors are Bragg gratings that are formed in the optical fiber.

5. A method according to claim I wherein bandwidths of the plurality of reflectors overlap and reflectivity levels of the plurality of reflectors are substantially the same.

6. A method according to claim 1 wherein the optical waveguide is coupled to an optical gain medium and the laser source is operated as a pump laser for the optical gain medium.

7. A method according to claim 1 that comprises coupling light in the optical waveguide into one or more second optical waveguides, wherein at least some of the reflectors are formed in or coupled to one or more of the second optical waveguides.

8. A method according to claim 1 wherein:
- a first reflector is formed in or coupled to the optical waveguide at a first optical distance from the laser source output to reflect a first portion of the light back to the laser source output, wherein the first portion of light has a magnitude that is sufficient to stabilize the laser source in a coherence-collapse mode of operation for one or more polarization orientations of the first portion of light at the laser source output; and
- a second reflector is formed in or coupled to the optical waveguide at a second optical distance from the laser source output to reflect a second portion of the light back to the laser source output, wherein the second optical distance is greater than the first optical distance and the second portion of light has a magnitude that is sufficient to stabilize the laser source in a coherence-collapse mode of operation for one or more polarization orientations of the second portion of light at the laser source output.

9. A method according to claim 8 wherein the second optical distance exceeds the first optical distance by an amount such that polarization of the first portion of light differs from polarization of the second portion of light by an average amount that exceeds about forty-five degrees.

10. A method according to claim 8 wherein the second reflector is formed in or coupled to the optical waveguide at an optical distance from the first reflector that exceeds a coherence length of the laser source.

11. A method according to claim 8 wherein the second reflector is formed in or coupled to the optical waveguide at an optical distance from the first reflector such that polarity of the first portion of light at the laser source output varies in a substantially random manner relative to polarity of the second portion of light at the laser source output.

12. A method according to claim 8 wherein the second reflector is formed in or coupled to the optical waveguide at an optical distance from the first reflector such that the first portion of light and the second portion of light are substantially incoherent.

13. A method according to claim 8 wherein the optical waveguide between the first and second reflectors is coiled, twisted, bent or stressed to induce birefringent properties into the optical waveguide.

14. A method according to claim 8 wherein the first optical distance exceeds a coherence length of the laser source.

15. A method according to claim 8 wherein the first optical distance is less than a coherence length of the laser source and the laser source is operated by a modulated electrical signal.

16. An apparatus for stabilizing operational characteristics of a laser source, the apparatus comprising:
- an optical waveguide coupled to an output of the laser source, wherein the optical waveguide receives light emitted from the laser source output and is polarization insensitive to the light; and
- a plurality of reflectors arranged to reflect portions of the light back to the laser source output such that the portions of light have two or more polarization orientations at the laser source output.

17. An apparatus according to claim 16 wherein reflectivity levels of two or more of the reflectors are such that respective portions of light reflected by the two or more reflectors collectively have a magnitude that is sufficient to stabilize the laser source in a coherence-mode of operation for one or more polarization orientations at the laser source output.

18. An apparatus according to claim 16 wherein a single reflector has a reflectivity level such that the portion of light reflected by the single reflector has a magnitude that is sufficient to stabilize the laser source in a coherence-collapse mode of operation for one or more polarization orientations of the respective portion of light at the laser source output.

19. An apparatus according to claim 16 wherein the optical waveguide comprises optical fiber and the reflectors are Bragg gratings that are formed in the optical fiber.

20. An apparatus according to claim 16 wherein bandwidths of the plurality of reflectors overlap and reflectivity levels of the plurality of reflectors are substantially the same.

21. An apparatus according to claim 16 in which the optical waveguide is coupled to an optical gain medium and the laser source is operated as a pump laser for the optical gain medium.

22. An apparatus method according to claim 16 that comprises an optical coupler that couples light in the optical waveguide into one or more second optical waveguides, wherein at least some of the reflectors are formed in or coupled to one or more of the second optical waveguides.

23. An apparatus according to claim 16 wherein:
- a first reflector formed in or coupled to the optical waveguide at a first optical distance from the laser source output that reflects a first portion of the light back to the laser source output, wherein the first reflector has a level of reflectivity such that the first portion of light has a magnitude that is sufficient to stabilize the laser source in a coherence-collapse mode of operation for one or more polarization orientations of the first portion of light at the laser source output;
- a second reflector formed in or coupled to the optical waveguide at a second optical distance from the laser source output that reflects a second portion of the light back to the laser source output, wherein the second optical distance is greater than the first optical distance and the second reflector has a level of reflectivity such that the second portion of light has a magnitude at the output port that is sufficient to stabilize the laser in a coherence-collapse mode of operation for one or more polarization orientations of the second portion of light at the laser source output.

24. An apparatus according to claim 23 wherein the second optical distance exceeds the first optical distance by an amount such that polarization of the first portion of light differs from polarization of the second portion of light by an average amount that exceeds about forty-five degrees.

25. An apparatus according to claim 23 wherein the second reflector is formed in or coupled to the optical waveguide at an optical distance from the first reflector that exceeds a coherence length of the laser source.

26. An apparatus according to claim 23 wherein the second reflector is formed in or coupled to the optical waveguide at an optical distance from the first reflector such that polarity of the first portion of light at the laser source output varies in a substantially random manner relative to polarity of the second portion of light at the laser source output.

27. An apparatus according to claim 23 wherein the second reflector is formed in or coupled to the optical waveguide at an optical distance from the first reflector such that the first portion of light and the second portion of light are substantially incoherent.

28. An apparatus according to claim 23 wherein the optical waveguide between the first and second reflectors is coiled, twisted, bent or stressed to induce birefringent properties into the optical waveguide.

29. An apparatus according to claim 23 wherein the first optical distance exceeds a coherence length of the laser source.

30. An apparatus according to claim 23 wherein the first optical distance is less than a coherence length of the laser source and the laser source is operated by a modulated electrical signal.

31. An apparatus comprising:
a laser source having an output for emission of light with a polarization orientation; and
an optical waveguide coupled to receive the light from the laser source output and having a plurality of reflectors, wherein the optical waveguide is polarization insensitive to the light and the plurality of reflectors are arranged to reflect portions of the light back to the laser source output to effect a higher level of stability in the laser source than is effected by a respective portion of light reflected by a single reflector.

32. An apparatus according to claim 31 wherein each reflector is arranged to reflect back to the laser source output a respective portion of the light that is of sufficient magnitude to stabilize the laser source in a coherence-collapse mode of operation for one or more polarization orientations of the respective portion of light at the laser source output.

33. An apparatus according to claim 31 wherein polarization of respective portions of light reflected by two of the reflectors differ by an average amount that exceeds about forty-five degrees.

34. An apparatus according to claim 31 wherein two of the reflectors are formed in or coupled to the optical waveguide and are separated by an optical distance that exceeds a coherence length of the laser source.

35. An apparatus according to claim 31 wherein two of the reflectors are arranged to reflect respective portions of light having a relative polarity that varies in a substantially random manner.

36. An apparatus according to claim 31 wherein a respective portion of light reflected by each reflector has a magnitude that is sufficient to stabilize the laser source in a coherence-collapse mode of operation for one or more polarization orientations of the respective portion of light at the laser source output.

37. A method according to claim 31 wherein the optical waveguide between two of the reflectors is coiled, twisted, bent or stressed to induce birefringent properties into the optical waveguide.

38. An apparatus according to claim 31 wherein each reflector is separated from the laser source by a respective optical distance that exceeds a coherence length of the laser source.

39. An apparatus according to claim 31 wherein bandwidths of the plurality of reflectors overlap and reflectivity levels of the plurality of reflectors are substantially the same.

40. An apparatus according to claim 31 in which the optical waveguide is coupled to an optical gain medium and the laser source operates as a pump laser for the gain medium.

41. An apparatus comprising:
a laser source having an output through which light is emitted; and
an optical waveguide coupled to the laser source output and comprising a first reflector and a second reflector, wherein the optical waveguide is polarization insensitive to the light and the first and second reflectors are arranged to reflect respective portions of the light back to the laser source output such that the portion of light reflected from the first reflector is substantially incoherent with respect to the portion of light reflected from the second reflector.

42. An apparatus according to claim 41 wherein the optical waveguide comprises one or more additional reflectors, wherein each additional reflector is arranged to reflect back to the laser source output a respective portion of the light that is substantially incoherent with respect to the portion of light reflected by another of the reflectors.

43. An apparatus according to claim 41 wherein polarization of the respective portions of light reflected by the first and second reflectors differ by an average amount that exceeds about forty-five degrees.

44. An apparatus according to claim 41 wherein an optical distance along the optical waveguide between the first and second reflectors exceeds a coherence length of the laser source.

45. An apparatus according to claim 41 wherein the first and second reflectors are arranged to reflect respective portions of light having a relative polarity that varies in a substantially random manner.

46. An apparatus according to claim 41 wherein the respective portion of light reflected by each reflector has a magnitude that is sufficient to stabilize the laser source in a coherence-collapse mode of operation for one or more polarization orientations of the respective portion of light at the laser source output.

47. A method according to claim 41 wherein the optical waveguide between the first and second reflectors is coiled, twisted, bent or stressed to induce birefringent properties into the optical waveguide.

48. An apparatus according to claim 41 wherein the first and second reflectors are separated from the laser source by an optical distance along the optical waveguide that exceeds a coherence length of the laser source.

49. An apparatus according to claim 41 wherein bandwidths of the first and second reflectors overlap and reflectivity levels of the first and second reflectors are substantially the same.

50. An apparatus according to claim 41 in which the optical waveguide is coupled to the optical gain medium and the laser source operates as a pump laser for the gain medium.

51. An apparatus for stabilizing operational characteristics of a plurality of laser sources, the apparatus comprising:
a plurality of optical waveguides that are polarization insensitive to light, wherein each optical waveguide is coupled to an output of a respective laser source and is coupled to one or more of the other optical waveguides; and
a plurality of reflectors formed in or coupled to the optical waveguides.

52. An apparatus according to claim 51 in which the coupling of the optical waveguides is wavelength sensitive.

53. An apparatus according to claim 51 in which the coupling of the plurality of optical waveguides is interposed between the plurality of laser sources and the plurality of reflectors.

54. An apparatus according to claim 51 in which the coupling of the plurality of optical waveguides is interposed between the plurality of laser sources and some but not all of the plurality of reflectors.

55. An apparatus according to claim 51 in which one or more of the optical waveguides are coupled to an optical gain medium and the laser source is operated as a pump laser for the optical gain medium.

56. An apparatus according to claim 51 in which the plurality of reflectors are arranged to reflect respective portions of light having relative polarity that vary in a substantially random manner.

57. An apparatus according to claim 51 in which the plurality of reflectors are arranged to reflect respective portions of light that are substantially incoherent with respect to one another.

* * * * *